US006052017A

United States Patent [19]
Pidutti et al.

[11] Patent Number: 6,052,017
[45] Date of Patent: Apr. 18, 2000

[54] METHOD AND CIRCUIT FOR ENABLING RAPID FLUX REVERSAL IN THE COIL OF A WRITE HEAD ASSOCIATED WITH A COMPUTER DISK DRIVE, OR THE LIKE

[75] Inventors: Albino Pidutti, Udine, Italy; Axel Alegre de La Soujeole, Scotts Valley; Elango Pakriswamy, Santa Clara, both of Calif.

[73] Assignee: STMicroelectronics, Inc., Carrollton, Tex.

[21] Appl. No.: 08/928,447

[22] Filed: Sep. 12, 1997

Related U.S. Application Data

[63] Continuation-in-part of application No. 08/884,993, Jun. 30, 1997.

[51] Int. Cl.$^7$ ................................................. H03K 17/74
[52] U.S. Cl. ........................... 327/424; 327/110; 327/588; 360/46; 360/68
[58] Field of Search ..................................... 327/110, 423, 327/424, 448, 508, 588; 363/58, 63; 330/146; 360/46, 67, 68

[56] References Cited

U.S. PATENT DOCUMENTS

| | | | |
|---|---|---|---|
| 4,454,454 | 6/1984 | Valentine | 318/293 |
| 4,535,203 | 8/1985 | Jenkins et al. | 379/333 |
| 5,221,881 | 6/1993 | Cameron | 318/254 |
| 5,285,135 | 2/1994 | Carobolante et al. | 318/254 |
| 5,297,024 | 3/1994 | Carobolante | 360/67 |
| 5,332,954 | 7/1994 | Lankin | 318/139 |
| 5,566,369 | 10/1996 | Carobolante | 360/75 |
| 5,642,065 | 6/1997 | Choi et al. | 327/110 |
| 5,712,536 | 1/1998 | Haas et al. | 315/247 |
| 5,757,215 | 5/1998 | Schuelke et al. | 327/110 |
| 5,841,603 | 11/1998 | Ramalho et al. | 360/68 |
| 5,867,334 | 2/1999 | Soichi et al. | 360/68 |
| 5,869,988 | 2/1999 | Jusuf et al. | 327/110 |

OTHER PUBLICATIONS

Irwin, "Maximum Average Power Transfer," *Basic Engineering Circuit Analysis*, 3d ed., pp. 453–454, date: Jan. 1990.

Pedrazzini, "IBM's Hard Disk Drive Load/Unload Technology,"*Computer Data Storage Newsletter*, Jul. 1997, vol. 10(7), Issue No. 114, p. 12.

*Primary Examiner*—Kenneth B. Wells
*Assistant Examiner*—Minh Nguyen
*Attorney, Agent, or Firm*—David V. Carlson; Theodore E. Galanthay; Lisa K. Jorgenson

[57] ABSTRACT

A method and apparatus, for applying a current to a coil of a write head assembly of a disk drive, or the like, to cause the flux within the coil to rapidly reverse, has an H-bridge having two pair of two switchable transistors. Each pair of the transistors is connected between a supply voltage and a reference potential, and is adapted to be connected to the coil between the two transistors of each pair. The two transistors of the first pair may be connected to receive a control signal to turn on complementary transistors of the first and second pair of transistors to selectively control current flow in the coil in first or second directions. A reference current source supplies a reference current, and one of the transistors in each of the first and second pairs of transistors is connected when turned on to mirror the reference current to control the currents in the coil. First and second parallel transistors are connected in parallel respectively with the mirror transistors, the first and second parallel transistors being connected to be turned on respectively by the control signal and the inverted control signal concurrently with the respective mirror transistor. A pair of timing elements turn off respective ones of the parallel transistors after a predetermined time so that when the parallel transistors are turned on, the current in the coil overshoots a value established by the mirror transistors.

24 Claims, 4 Drawing Sheets

METHOD AND CIRCUIT FOR ENABLING RAPID FLUX REVERSAL IN THE COIL OF A WRITE HEAD ASSOCIATED WITH A COMPUTER DISK DRIVE, OR THE LIKE

CROSS REFERENCE TO RELATED APPLICATION

This application is a continuation-in-part of copending patent application Ser. No. 08/884,993, filed Jun. 30, 1997.

This application is also related to copending patent application, filed on even date herewith, application Ser. No. 08/928,999.

BACKGROUND OF THE INVENTION

1. Field of the Invention

This invention relates to improvements in methods and circuits for driving inductive loads, or the like, to which it is desired to apply signals having a fast rise time, and more particularly to improvements in methods and circuits for driving inductive loads of the type used in conjunction with a write head of a disk drives, or the like.

2. Relevant Background

Most computer systems include one or more associated disk drives, which may be built into the computer system, or which may be external to the computer system for connection via known means to the system. Typically, disk drives have at least one rotating magnetic medium and associated head mechanisms that are carried adjacent the material. The heads are radially positionable to selectively write information to, or read information from, precise positions on the disk medium. Such disk drives may be, for example, so-called hard disk drives, floppy drives, or the like.

Data is written to the associated data disk by applying a series of signals to the write head according to the digital information to be stored on the magnetic disk media. The write head has a coil and one or more associated pole pieces that are located in proximity to the disk media. As the magnetic flux changes in the head, the magnetic domains of the magnetic media of the disk are aligned in predetermined directions for subsequent read operations. Typically, a small space separates each magnetic domain transition to enable successive transitions on the magnetic media to be distinguished from each other.

Since the disk is moving relative to the head, it can be seen that if the small space separating each magnetic domain transition is not sufficiently wide, difficulty may be encountered in distinguishing successive magnetic transitions. This may result in errors in reading the data contained on the disk, which is, of course, undesirable.

Meanwhile, as computers are becoming faster and faster, it is becoming increasingly important to increase the speed at which data can be written to the disk media. However, since the data signals are in the form of square wave transitions, if the rise time of the leading edges of the square waves is large, the small space between magnetic media transitions also becomes large, which reduces the effective rate at which data can be accurately written and read. Since the write head assembly includes at least one coil, forcing the current to rise rapidly, or to reverse flux directions, within the write head is difficult.

In the past, data writing circuits used to supply such write signals to the heads include preamplifier circuits to drive the current through selected legs of an "H-bridge" circuit, which is capable of allowing relatively fast current reversals for accurate data reproduction.

What is needed, therefore, is a method and circuit for driving an inductive load of the type used in conjunction with a write head of a disk drive for association with a computer or the like, with a signal that enables a maximum flux reversal rate in the driver coil.

SUMMARY OF THE INVENTION

In light of the above, therefore, is an object of the invention to provide a method and circuit for driving an inductive load.

It is another object of the invention to provide a method and circuit of the type described for driving an inductive load of the type used in conjunction with a write head of a disk drive for association with a computer or the like.

It is another object of the invention to provide a method and circuit of the type described for driving an inductive load of the type used in conjunction with a write head of a disk drive for association with a computer or the like with a signal that enables a maximum flux reversal rate in the driver coil.

It is another object of the invention to provide a method and circuit of the type described for driving an inductive load of the type described with a signal having a fast rise time.

It is another object of the invention to provide a method and circuit of the type described for driving an inductive load of the type described that enables data to be written faster, with more accurate data transitions on the recording media than with typical H-bridge drivers.

These and other objects, features and advantages of the invention will be apparent to those skilled in the art from the following detailed description of the invention, when read in conjunction with the accompanying drawings and appended claims.

The objects of the invention are addressed by a circuit that provides a measured amount of initial "overshoot" current to pulses that are applied to the coil of the head mechanism to initiate a flux reversal within the coil of the head assembly more rapidly than would occur using only ordinary H-bridge techniques. Thus, in accordance with a broad aspect of the invention, a circuit is presented for applying a current to a coil of a write head assembly of a computer disk drive to rapidly change the direction of the flux in the coil of the head assembly. The circuit includes a circuit for generating at least one current pulse for delivery to the write coil to initiate a flux in a desired direction within the coil. In addition, the circuit includes a circuit for introducing an overshoot current onto a leading edge of the at least one current pulse to rapidly initiate flux reversal within the coil of the head assembly.

According to another broad aspect of the invention, an apparatus is presented for applying a current to a write coil of a write head assembly using an H-bridge of the type that includes two pair of two switchable transistors, each pair connected between a supply voltage and a reference potential and adapted to be connected to the coil between the two transistors of each pair. The two transistors of the first pair are adapted to be connected to receive a control signal to turn on complementary transistors of the first and second pair of transistors to selectively control current flow in the coil in first or second directions. A reference current source supplies a reference current, and one of the transistors in each of the first and second pairs of transistors is connected when turned on to mirror the reference current to control the currents in the coil. First and second parallel transistors are connected in parallel respectively with the mirror transistors, the first and second parallel transistors being connected to be turned on respectively by the control signal and the inverted control signal concurrently with the respective mirror transistor. A pair of timing elements turn off respective ones of the parallel transistors after a predetermined time so that when the parallel transistors are turned on, the current in the coil overshoots a value established by the mirror transistors.

According to another broad aspect of the invention, an apparatus is presented for applying a current to a write coil of a magnetic head assembly. The apparatus has an H-bridge, which has first and second current flow paths, each including the write coil. First and second mirror transistors, which are selectively turned on in response respectively to a control signal and an inverted control signal, are connected respectively in the first and second current flow paths for mirroring a reference current to control the current in the write coil. First and second current boost transistors are connected respectively in parallel with the first and second mirror transistors, and are connected to be turned on concurrently with the first and second mirror transistors. The first and second current boost transistors apply a boost current to the write coil for a predetermined time after being turned on.

Capacitors are connected to respective control elements of the first and second current boost transistors to control the time the current boost transistors are turned on at a level above a current level of the mirror transistors.

According to yet another broad aspect of the invention, an apparatus is presented for producing an overshoot current to a coil connected across an H-bridge upon a current direction transition. The apparatus has a reference current generator connected to current control transistors of the H-bridge in a manner by which the current control transistors mirror a current of the reference current generator. A pair of parallel transistors are connected in parallel with respective ones of the current control transistors to be switched on concurrently with the respective current control transistors, and timing elements are connected to the parallel transistors to limit the time the parallel transistors conduct at a current level above a current level of the current control transistors.

According to yet another broad aspect of the invention, a method is presented for producing an overshoot current to a coil connected across an H-bridge upon a current direction transition. The method includes mirroring a reference current in current control transistors of the H-bridge and providing a pair of in parallel with respective ones of the current control transistors. The method also includes switching the parallel transistors on concurrently with the respective current control transistors and timing a conduction of the parallel transistors to limit the time the parallel transistors conduct at a current level above a current level of the current control transistors.

According to yet another broad aspect of the invention, a method is presented for increasing a speed in which a flux within a write head associated with a computer hard disk drive is reversed. The method includes mirroring a reference current in current control transistors of an H-bridge to control a current level in the coil, and providing a pair of parallel transistors in parallel with respective ones of the current control transistors. The method additionally include switching the parallel transistors on concurrently with the respective current control transistors, and timing a conduction of the parallel transistors to limit the time the parallel transistors conduct at a current level above a current level of the current control transistors.

BRIEF DESCRIPTION OF THE DRAWINGS

The invention is shown in the accompanying drawings in which.

In the various figures of the drawing, like reference numerals are used to denote like or similar parts.

DETAILED DESCRIPTION OF THE PREFERRED EMBODIMENTS

Figure 1:
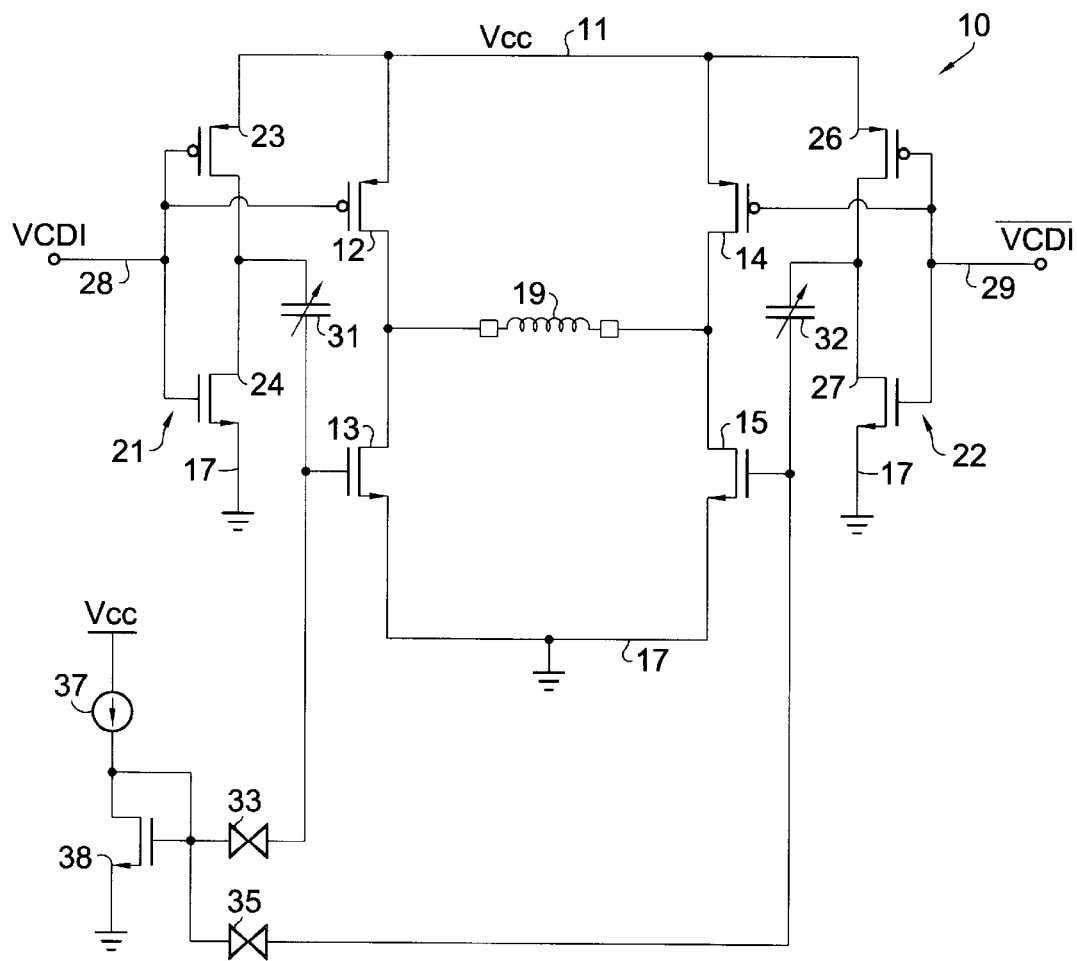
FIG. 1 is an electrical schematic diagram of an H-bridge circuit for driving inductive loads.

An example of a typical H-bridge coil driving circuit 10, of the type similar to that described in copending patent application Ser. No. 08/928,999, filed contemporaneously herewith, incorporated herein by reference, for providing write signals to a magnetic head assembly, is shown in FIG. 1. The circuit 10 includes an H-bridge driver circuit that includes four transistors, 12–15 connected between a $V_{cc}$ rail 11 and ground 17. A coil 19, used, for example, to provide magnetic flux as a part of a write head mechanism, is connected between the center legs of the H-bridge 10, as shown.

It can be seen that, depending on the gate biases applied to the respective transistors 12–15, the current flows through the coil 19 in one direction or another. That is, one current flow path includes the transistor 14, coil 19 from right to left, and transistor 13, and the other current flow path includes transistor 12, the coil 19 from left to right, and the transistor 15.

The conduction of the transistors 12–15 is controlled by respective driver control inverter circuits 21 and 22, each of which includes a pair of transistors 23–24 and 26–27, respectively, connected between $V_{cc}$ 11 and ground 17. Control of the transistors 12–15, therefore, is controlled by the states or voltages applied to the input lines 28 and 29, respectively. It can be seen that the signals applied to the input lines 29 and 28 are out of phase with respect to each other, so that either transistor set 13 and 14 or transistor set 12 and 15 are in conduction, but not both sets at the same time.

The gates of transistors 13 and 15 are also connected selectively by respective transmission gates 33 and 35 to the gate of a transistor 38 through which current from a reference current source 37 flows. Thus, the transistors 13 and 15 may be selected to form current mirrors with the transistor 38 to mirror the reference current flowing therethrough. Therefore, by selectively actuating the transmission gates 33 or 35, the current that flows through either transistor 13 or 15 is controlled to a predetermined level, thereby controlling the magnitude of the current flowing in the coil 19.

Thus, the magnetic flux in the coil of the head mechanism associated with the circuit 10 may be reversed by applying appropriate signals to the input lines 28 and 29. However, as data rates increase, the rates at which the heads can write the data to the magnetic media is limited by the speed at which the magnetic flux heads can be reversed, especially as the data rates approach the maximum physical flux reversal rate of the driver circuitry.

Figure 2:
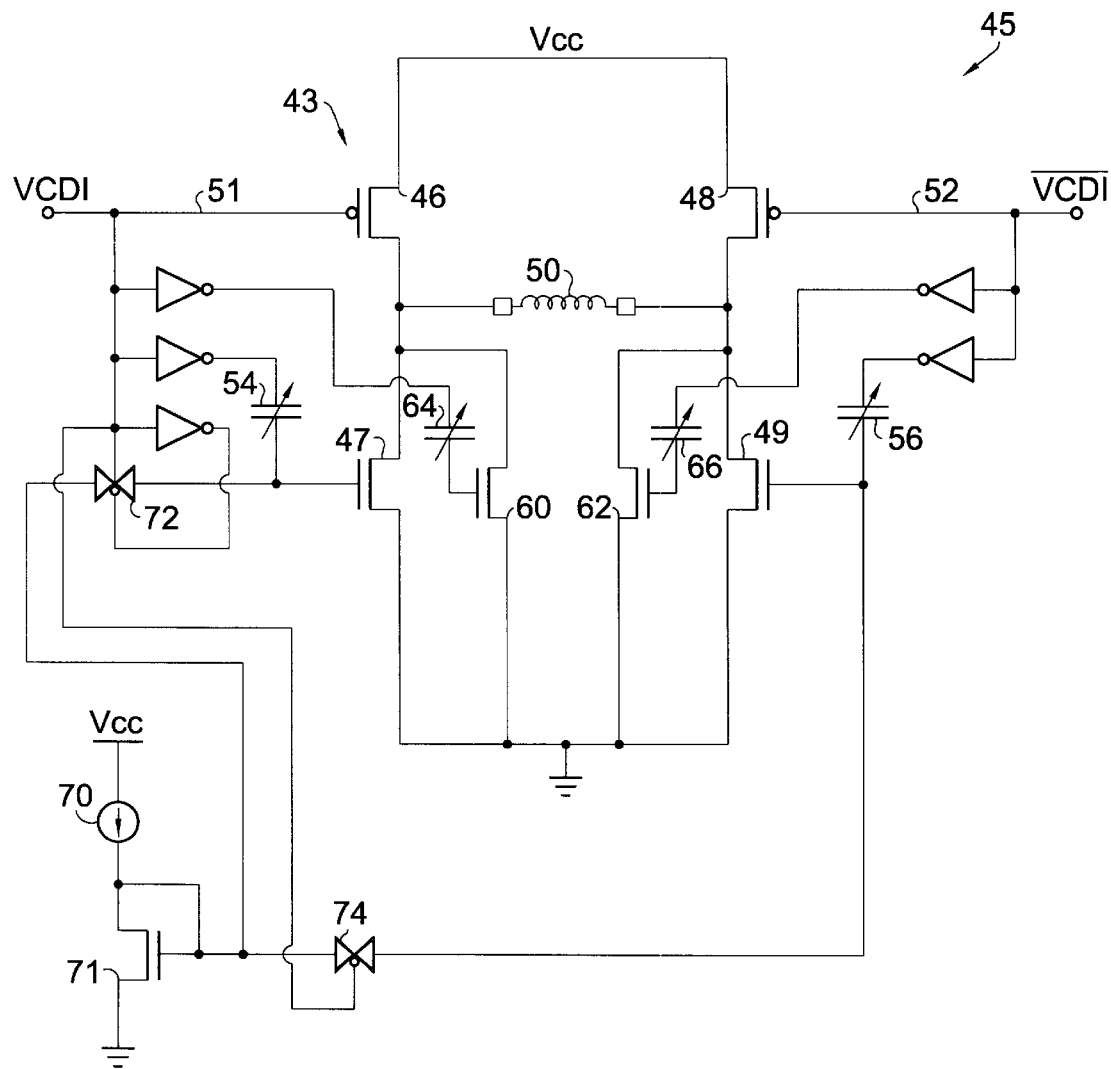
FIG. 2 is an electrical schematic diagram of a write coil driving circuit, in accordance with the present invention.

With reference now to FIG. 2, an electrical schematic diagram of a write coil driver 45, in accordance with the present invention, is shown. The write coil driver circuit 45 has an H-bridge driver circuit 43, which includes four transistors 46–49.

The transistors 46–49 are connected between $V_{cc}$ and ground, with transistors 46 and 47 in series, and transistors 48 and 49 in series.

The transistors 46–49 are selectively switchable into conduction to direct current through a coil 50 that is associated with a magnetic write head mechanism, such as that used in conjunction with computer disk drives or the like. Thus, depending upon which pair of transistors 46–49 or 48–47 are currently conducting, the current will flow in a corresponding direction in the coil 50, in a manner similar to that described above with respect to FIG. 1.

The respective pairs of opposing transistors in the H-bridge 43 are controlled by input signals VCDI on line 51 and $\overline{\text{VCDI}}$ on line 52. The signals VCDI and $\overline{\text{VCDI}}$ are applied to the respective gates of transistors 46 and 47 on the left side of the circuit 45 and gates of transistors 48 and 49 on the right hand of the circuit 45. The inverted signals on lines 51 and 52 are applied to the gates of transistors 47 and 49, respectively, by variable capacitors 54 and 56, which serve to control the switching times thereof, and to isolate the gates of the lower transistors from the respective inverters after switching has occurred.

According to the invention, additional transistors 60 and 62 are connected in parallel with respective transistors 47 and 49. The gates of the transistors 60 and 62 are connected to inverted input signals on the input lines 51 and 52 by respective variable capacitors 64 and 66.

Finally, the circuit 45 is provided with a reference current source 70, which serves as the reference current for the current that is mirrored to control the current in the coil 50. A reference current transistor 71, through which the reference current from the current source 70 flows has its gate connected by a transmission gate 72 to the gate of transistor 47 and by a transmission gate 74 to the gate of the transistor 49. The transmission gates 72 and 74 are controlled by the state of the inverted signal on input line 51 to selectively connect the gates of the respective transistors 71 to 47 or 49. Thus, when either of the transmission gates 72 or 74 is turned on, the respective lower transistor 47 or 49 is connected to mirror the current flowing through the transistor 71. Therefore, the upper transistors 46 and 48 of the H-bridge 45 essentially serve as switching transistors, whereas the lower transistors 47 and 49 serve to control precisely the magnitude of the current which flows through the write coil 59.

Since the transistors 60 and 62 are connected by capacitors directly to the respective control lines 51 and 52, they switch concurrently with the lower switch transistors 47 and 49, but are not current limited. Thus, when either transistors 60 or 62 is switched on, the switched on transistor allow an additional current to flow through the coil 50 until a charge accumulates on its respective gate capacitor. After that point, the current in the transistors 47 or 49 controls the current through the coil 50.

The value of the capacitors 64 and 66 are selected so that transistors 60 and 62 are turned on for a predetermined fraction of the transition time when the respective parallel transistor 47 or 49 is turned on. The result of the transistor 60 or 62 being turned on for the predetermined fraction of the transition time results in an additional current being drawn through the write coil 50 during the transition of the current. This temporary overdrive current results in an overshoot current being applied to the write head to increase the rate at which the magnetic flux within the write head reverses. It can be appreciated that the ratio of the width-to-length dimensions of transistors 47 and 60 and of transistors 49 and 62 defines the amount of excess current delivered by the modified bridge and the corresponding overshoot current supplied to the coil of the write head. The ratio of the variable capacitors 64 and 66 to the gate capacitances of their associated transistors 60 and 62 defines the precise amount of current overshoot.

Figure 3:
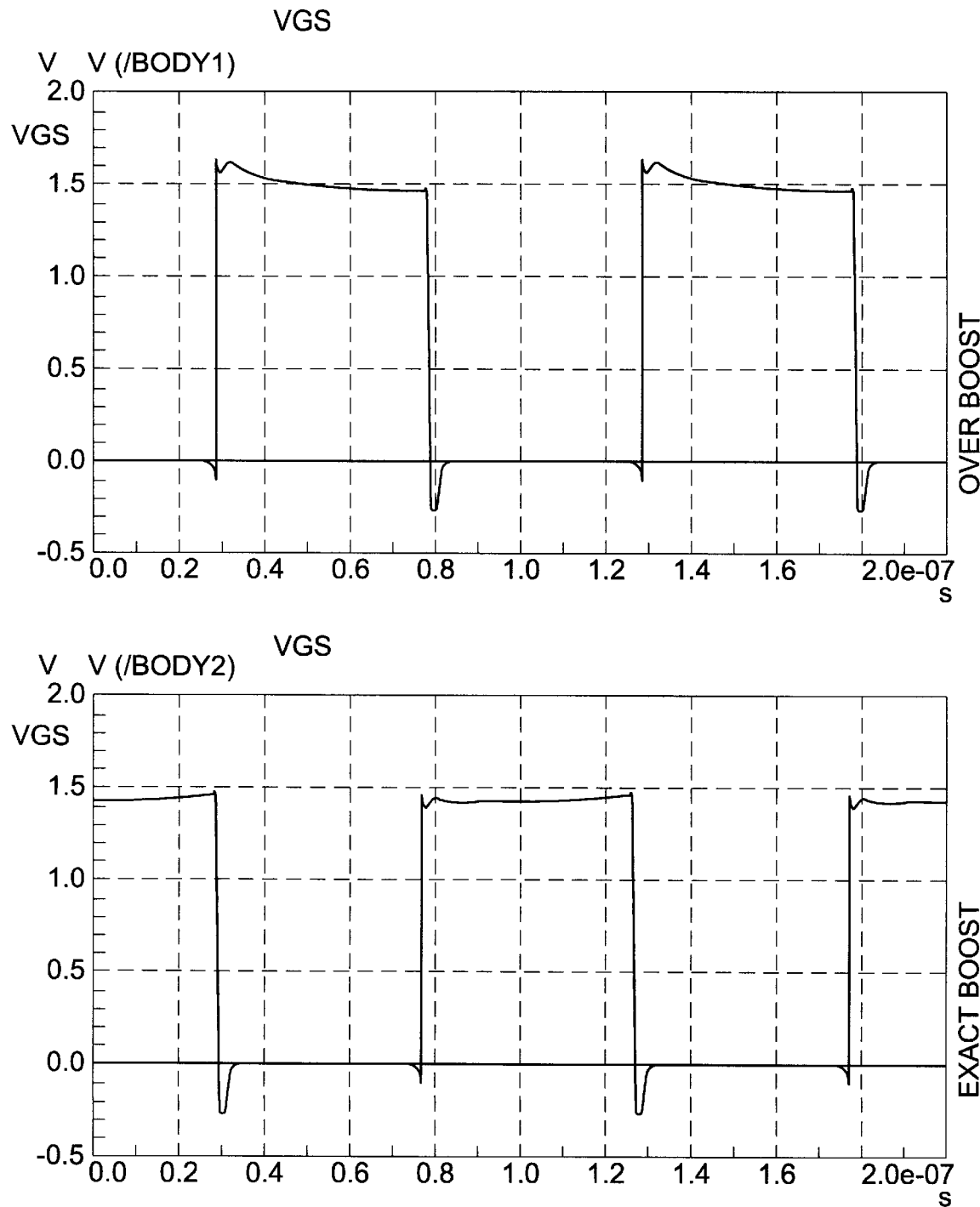
FIG. 3 are waveforms showing the $V_{GS}$ of the lower switching transistors illustrating the effects of an exact boost in the lower graph, and an over boost in the upper graph.
Figure 4:
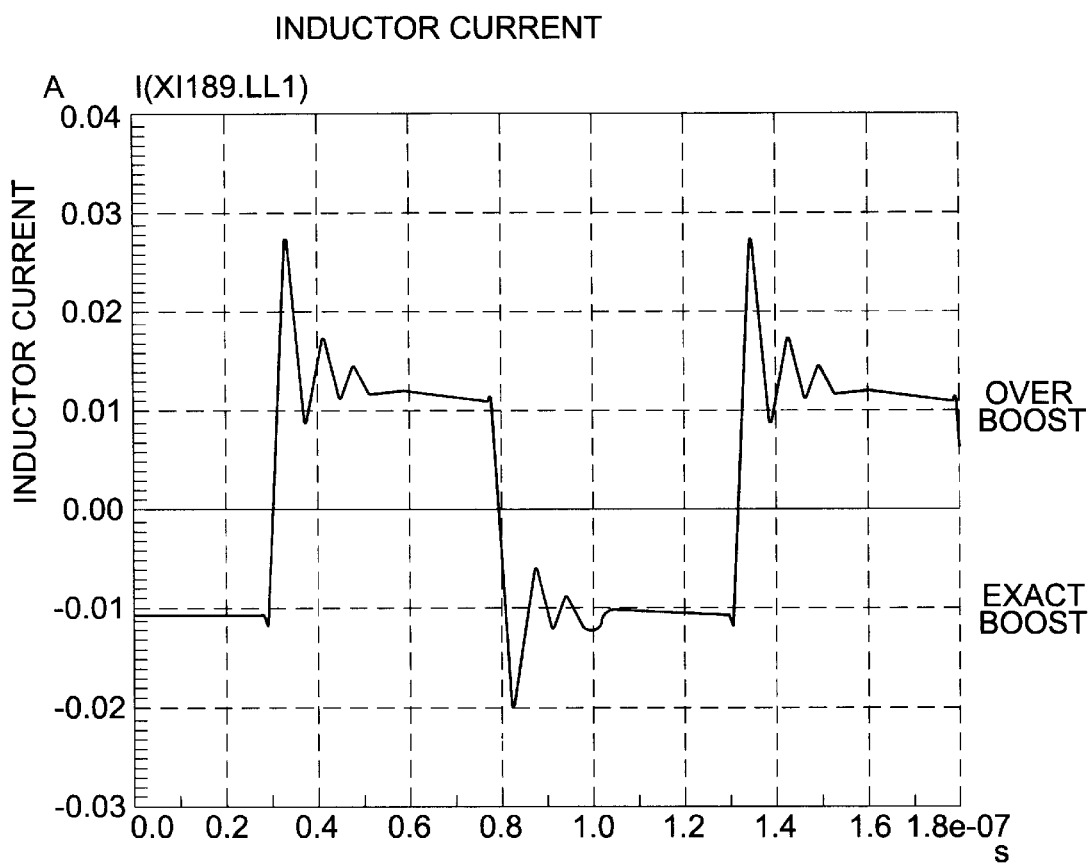
FIG. 4 is a waveform showing the inductor current illustrating the effects of an over boost current for rapid flux reversal.

The voltage wave forms that are achieved using the circuit 45 of the invention are illustrated in FIGS. 3 and 4. In FIG. 3, the upper wave form shows the voltage, $V_{GS}$, that is overboosted and the lower wave form shows the voltage $V_{GS}$, that is an exact boost voltage across the lower transistors 47 and 49 in FIG. 2.

The corresponding inductor currents that are generated for the overboost and exact boost conditions of FIG. 3 are shown in FIG. 4. Because of the parasitic capacitances, the write coil of the head assembly is not a pure inductor, but provides an LC system. Consequently, the currents through the coil may have some oscillations, as can be seen. The frequency of the oscillations does not depend on the program value of the current.

One advantage of the overboost technique of the invention, compared, for example, to the case of an exact boost, is that the inductor current value during an undershoot which is about one-half of the programmed current can demagnetize the head and erase the data written during the first overshoot. This phenomena also reduces the writing frequency. From this point of view, the overshoot condition is much safer, in which the current during the first undershoot is about eighty percent of the programmed current.

Another advantage of the overboost technique of the invention is that the magnetic inertia of the pole pieces of the head mechanism, which act much like a low pass filter, is overcome. By overdriving the current into the coil included in the head mechanism, the rise time of the flux can be greatly increased.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. An apparatus to apply a current to a coil of a write head assembly, the apparatus comprising;

an H-bridge including a first pair of two switchable transistors and a second pair of two switchable transistors each pair connected between a supply voltage and a reference potential and adapted to be connected to said coil between said two transistors of each pair, said two transistors of said first pair being adapted to be connected to receive a control signal to turn on one of said two transistors of said first pair and to turn off another of said two transistors of said first pair, said two transistors of said second pair being adapted to be connected to receive an inverted control signal to turn on one of said two transistors of said second pair and to turn off another of said two transistors of said second pair, whereby when said one transistor of said first pair is turned on and said another transistor of said second pair is turned off, current flows in said coil in a first direction, and when said another transistor of said first pair is turned on and said one transistor of said second pair is turned off, current flows in said coil in a second direction, mirror transistors wherein one of said transistors in each of said first and second pairs of transistors being connected to said coil, and if turned on, mirrors a reference current supplied by a current mirror circuit coupled to transistors within said first and second pairs of transistors, whereby said currents in said coil are controlled by said reference circuit, first and second parallel transistors connected in parallel respectively with said transistor in said first and second pairs of transistors which are connected to mirror said reference current, said first and second parallel transistors being connected to be turned on respectively by said control signal and said inverted control signal concurrently with said respective transistor in said first and second pairs of transistors in parallel with which said parallel transistors are connected, and a pair of timing elements connected to respective ones of said parallel transistors to turn off said respective ones of said parallel transistors after a predetermined time, whereby if said parallel transistors are turned on, said current in said coil overshoots a value established by said mirror transistors.

2. The apparatus of claim 1 wherein said timing elements comprise capacitors connected to respective gates of said parallel transistors.

3. The apparatus of claim 1 wherein said first and second pair of two switchable transistors of said H-bridge and said first and second parallel transistors comprise MOS transistors.

4. The apparatus of claim 1 wherein said one of said transistors in each of said first and second pairs of transistors are connected by transfer gates to said reference current, said reference gates being controlled respectively by said control signal and said inverted control signal.

5. The apparatus of claim 1, further comprising additional timing elements connected to gates of said mirror transistors to control said mirror transistors to provide an initial amount of current overshoot to said coil.

6. The apparatus of claim 5 wherein said additional timing elements comprise capacitors connected to respective gates of said mirror transistors.

7. An apparatus to apply a current to a write coil of a magnetic head assembly, the apparatus comprising an H-bridge including first and second current flow paths, each including said coil, first and second mirror transistors included in the H-bridge and which are selectively turned on in response respectively to a control signal and an inverted control signal, said mirror transistors being connected respectively in said first and second current flow paths for mirroring a reference current to control said current in said coil, first and second current boost transistors connected respectively in parallel with said first and second mirror transistors, and connected to be turned on concurrently with said first and second mirror transistors, said first and second current boost transistors applying a boost current to said coil for a predetermined time after being turned on, and a pair of timing elements respectively connected to said first and second boost transistors to turn said first and second transistors on and off.

8. The apparatus of claim 7 wherein said timing elements comprise capacitors connected to respective gates of said first and second current boost transistors to control a time said current boost transistors are turned on at a level above a current level of said mirror transistors.

9. The apparatus of claim 7 wherein said first and second mirror transistors and said first and second current boost transistors comprise MOS transistors.

10. The apparatus of claim 7 wherein said mirror transistors are connected by transfer gates to said reference current, said reference gates being controlled respectively by said control signal and said inverted control signal.

11. The apparatus of claim 7, further comprising additional timing elements connected to gates of said first and second mirror transistors to control said first and second mirror transistors to provide an initial amount of current overshoot to said coil.

12. The apparatus of claim 11 wherein said additional timing elements comprise capacitors connected to respective gates of said first and second mirror transistors.

13. Apparatus for producing an overshoot current to a coil connected across an H-bridge upon a current direction transition, comprising:

a reference current generator connected to current control transistors of said H-bridge in a manner by which said current control transistors mirror a current of said reference current generator;

a pair of parallel transistors connected in parallel with respective ones of said current control transistors to be switched on concurrently with said respective current control transistors; and timing elements connected to said parallel transistors to limit the time said parallel transistors conduct at a current level above a current level of said current control transistors.

14. The apparatus of claim 13 wherein said timing elements comprise capacitors connected to respective gates of said parallel transistors.

15. The apparatus of claim 13 wherein said current control transistors and said parallel transistors comprise MOS transistors.

16. The apparatus of claim 13 wherein said current control transistors are connected by transfer gates to said reference current generator, said reference gates being controlled respectively by an H-bridge control signal and an inverted H-bridge control signal.

17. The apparatus of claim 13, further comprising additional timing elements connected to gates of said current control transistors to control said current control transistors to provide an initial amount of current overshoot to said coil.

18. The apparatus of claim 17 wherein said additional timing elements comprise capacitors connected to respective gates of said current control transistors.

19. A circuit for applying a current to a coil of a head assembly of a computer disk drive, comprising:

a coil for applying a magnetic flux for recording data on a magnetic media of said disk drive, a circuit for generating at least one current pulse for a delivery to said coil to generate magnetic flux therein, and a circuit for introducing an overshoot current onto a leading edge of said at least one current pulse to initiate a change in flux direction in said coil, wherein said circuit for introducing an overshoot current comprises a pair of parallel transistors coupled in parallel to a pair of switching transistors wherein said overshoot current is introduced if said parallel transistors turn on and a pair of timing elements connected to respective ones of said pair of parallel transistors to control said parallel transistors.

20. A method for producing an overshoot current to a coil connected across an H-bridge upon a current direction transition, comprising:

mirroring a reference current in current control transistors of said H-bridge;

providing a pair of parallel transistors in parallel with respective ones of said current control transistors;

switching said parallel transistors on concurrently with said respective current control transistors; and timing a conduction of said parallel transistors to limit the time said parallel transistors conduct at a current level above a current level of said current control transistors.

21. The method of claim 20 wherein said timing the conduction of said parallel transistors comprises allowing capacitors connected to respective gates of said parallel transistors to discharge.

22. The method of claim 20, further comprising providing transfer gates between said reference current and said current control transistors that are enabled by H-bridge control signals.

23. The method of claim 20, further comprising providing additional timing elements to gates of said current control transistors to control said current control transistors to provide an initial amount of current overshoot to said coil.

24. A method for increasing a speed of flux reversal of a write head associated with a computer hard disk drive, comprising:

mirroring a reference current in current control transistors of an H-bridge to control a current level in a coil;

providing a pair of parallel transistors in parallel with respective ones of said current control transistors;

switching said parallel transistors on concurrently with said respective current control transistors; and timing a conduction of said parallel transistors to limit the time said parallel transistors conduct at a current level above a current level of said current control transistors.

* * * * *